(12) United States Patent
Liu et al.

(10) Patent No.: US 12,268,082 B2
(45) Date of Patent: Apr. 1, 2025

(54) STRETCHABLE DISPLAY SUBSTRATE AND MANUFACTURING METHOD THEREOF

(71) Applicant: BOE Technology Group Co., Ltd., Beijing (CN)

(72) Inventors: Wenqi Liu, Beijing (CN); Jinxiang Xue, Beijing (CN); Wei Quan, Beijing (CN); Qingyu Huang, Beijing (CN); Jingkai Ni, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 122 days.

(21) Appl. No.: 17/799,807

(22) PCT Filed: Nov. 10, 2021

(86) PCT No.: PCT/CN2021/129771
§ 371 (c)(1),
(2) Date: Aug. 15, 2022

(87) PCT Pub. No.: WO2022/179185
PCT Pub. Date: Sep. 1, 2022

(65) Prior Publication Data
US 2024/0215430 A1    Jun. 27, 2024

(30) Foreign Application Priority Data
Feb. 26, 2021  (CN) .......................... 202110219236.4

(51) Int. Cl.
*H10K 77/10* (2023.01)
*H10K 59/12* (2023.01)
(Continued)

(52) U.S. Cl.
CPC ....... *H10K 77/111* (2023.02); *H10K 59/1201* (2023.02); *H10K 59/127* (2023.02);
(Continued)

(58) Field of Classification Search
CPC .. H10K 77/111; H10K 59/127; H10L 59/1201
See application file for complete search history.

(56) References Cited

U.S. PATENT DOCUMENTS

| | | | | |
|---|---|---|---|---|
| 7,732,229 | B2* | 6/2010 | Leidholm | H10F 19/35 257/E31.127 |
| 11,334,119 | B2* | 5/2022 | Hong | H10K 50/8426 |

(Continued)

FOREIGN PATENT DOCUMENTS

| | | |
|---|---|---|
| CN | 111180485 A | 5/2020 |
| CN | 111370454 A | 7/2020 |

(Continued)

OTHER PUBLICATIONS

PCT/CN2021/129771 international search report and written opinion.

*Primary Examiner* — Thao P Le
(74) *Attorney, Agent, or Firm* — IPro, PLLC

(57) ABSTRACT

The present disclosure provides a stretchable display substrate and a manufacturing method. The stretchable display substrate includes: a base substrate, a plurality of opening patterns being distributed on the base substrate, a plurality of bridges being formed between adjacent ones of at least a part of opening patterns in the plurality of opening patterns to define islands; a plurality of display units, at least one display unit being arranged on each island; a plurality of wiring units each coupled between the display units on the islands and arranged on the bridge; and a thin film encapsulation layer including a first encapsulation portion covering a side of each display unit away from the base substrate and a second encapsulation portion at least covering a side of each display unit adjacent to the opening pattern. Each of at least a part of opening patterns has different opening sizes at a side of the base substrate adjacent to the display unit and a side of the base substrate away from the display unit, and (Continued)

the opening pattern has at least one step-like structure at a side adjacent to the island. According to the present disclosure, it is able to improve the reliability of a display element.

20 Claims, 5 Drawing Sheets

(51) Int. Cl.
*H10K 59/127* (2023.01)
*H10K 59/131* (2023.01)
*H10K 59/80* (2023.01)
*H10K 71/80* (2023.01)
*H10K 102/00* (2023.01)

(52) U.S. Cl.
CPC ......... *H10K 59/131* (2023.02); *H10K 59/873* (2023.02); *H10K 71/80* (2023.02); *H10K 2102/311* (2023.02)

(56) References Cited

U.S. PATENT DOCUMENTS

| | | | |
|---|---|---|---|
| 2012/0161112 A1* | 6/2012 | Lowenthal | H10F 71/1276 257/E51.024 |
| 2020/0152842 A1 | 5/2020 | Park et al. | |
| 2021/0066402 A1* | 3/2021 | Pu | H10K 59/121 |
| 2021/0119178 A1* | 4/2021 | Song | H10K 59/8791 |
| 2022/0344422 A1* | 10/2022 | Xue | H10K 71/00 |
| 2023/0119532 A1* | 4/2023 | Jeon | G06F 3/0446 257/40 |
| 2023/0345772 A1* | 10/2023 | Wei | H10K 59/124 |
| 2023/0354643 A1* | 11/2023 | Sato | G09G 3/3233 |
| 2024/0179951 A1* | 5/2024 | Yang | H10K 59/80515 |
| 2024/0276778 A1* | 8/2024 | Liu | H10K 59/122 |

FOREIGN PATENT DOCUMENTS

| | | |
|---|---|---|
| CN | 111554831 A | 8/2020 |
| CN | 112038389 A | 12/2020 |
| CN | 113013361 A | 6/2021 |

* cited by examiner

STRETCHABLE DISPLAY SUBSTRATE AND MANUFACTURING METHOD THEREOF

CROSS-REFERENCE TO RELATED APPLICATION

This application is the U.S. national phase of PCT Application No. PCT/CN2021/129771 filed on Nov. 10, 2021, which claims Chinese priority No. 202110219236.4 filed on Feb. 26, 2021, the disclosure of which are incorporated in their entirety by reference herein.

TECHNICAL FIELD

The present disclosure relates to the field of display technology, in particular to a stretchable display substrate and its manufacturing method.

BACKGROUND

Recently, as a flat-panel display element, a self-luminescent Organic Light-Emitting Diode (OLED) has attracted more and more attentions. Along with the rapid development of the display technology, a better display mode and a better display effect than conventional are highly demanded and such concepts as being transparent, flexible and stretchable have become research hotspots. In addition, the OELD display technology has become more and more mature, and the above concepts are gradually realized. In the related art, the stretchable OLED display element has such a problem as poor reliability.

SUMMARY

An object of the present disclosure is to provide a stretchable display substrate and its manufacturing method, so as to improve the reliability of the display element.

The present disclosure provides the following technical solutions.

In one aspect, the present disclosure provides in some embodiments a stretchable display substrate, including: a base substrate, a plurality of opening patterns being distributed on the base substrate, a plurality of bridges being formed between adjacent ones of at least a part of opening patterns in the plurality of opening patterns to define islands: a plurality of display units, at least one display unit being arranged on each island: a plurality of wiring units each coupled between the display units on the islands and arranged on the bridge; and a thin film encapsulation layer including a first encapsulation portion covering a side of each display unit away from the base substrate and a second encapsulation portion at least covering a side of each display unit adjacent to the opening pattern, the second encapsulation portion being used to protect a side of the display unit adjacent to the opening pattern. Each of at least a part of opening patterns has different opening sizes at a side of the base substrate adjacent to the display unit and a side of the base substrate away from the display unit, the opening pattern has at least one step-like structure at a side adjacent to the island, and the thin film encapsulation layer is interrupted at the step-like structure.

In a possible embodiment of the present disclosure, the base substrate includes a first substrate and a second substrate arranged at a side of the first substrate adjacent to the display unit, and the opening pattern has different opening sizes in the first substrate and the second substrate.

In a possible embodiment of the present disclosure, the opening size of the opening pattern in the first substrate is smaller than the opening size of the opening pattern in the second substrate, at least a part of the first substrate adjacent to the second substrate is not covered by the second substrate and provided with a first step-like structure, and a region of the first substrate adjacent to the second substrate and not covered by the second substrate is a first step surface of the first step-like structure.

In a possible embodiment of the present disclosure, a spacer is arranged on the first step surface, a third encapsulation portion is arranged at a side of the spacer away from the first substrate, and the third encapsulation portion is separated from the second encapsulation portion through the spacer.

In a possible embodiment of the present disclosure, the spacer includes a continuous spacer extending in a first direction, and the first direction is an extension direction of a boundary between the island and the opening pattern: or the spacer includes discrete spacers arranged in at least one row in a direction away from the display unit, the discrete spacers in each row include a plurality of discrete spacers spaced apart from each other in the first direction.

In a possible embodiment of the present disclosure, a sectional shape of the spacer is at least one of an inverted-trapezoidal shape or an inverted-triangular shape in a direction perpendicular to the base substrate.

In a possible embodiment of the present disclosure, the first step surface is provided with a plurality of protrusions at a side of the spacer adjacent to the opening pattern and/or a side of the spacer away from the opening pattern, and a height of each protrusion in a direction perpendicular to the first substrate is smaller than a height of the spacer in the direction perpendicular to the first substrate.

In a possible embodiment of the present disclosure, each protrusion is provided with a snow-like, spherical or net-like pattern.

In a possible embodiment of the present disclosure, the opening size of the opening pattern in the first substrate is greater than the opening size of the opening pattern in the second substrate, at least a part of the second substrate adjacent to the first substrate does not overlap the first substrate and is provided with a second step-like structure, a region of the second substrate adjacent to the first substrate and not overlapping the first substrate is a second step surface of the second step-like structure, and the second encapsulation portion is interrupted at the second step surface.

In a possible embodiment of the present disclosure, the stretchable display substrate further includes a first buffer layer, the first buffer layer covers the first step surface and a side of the first substrate adjacent to the opening pattern in a shape-following manner, a part of the second encapsulation portion covers a side of the first buffer layer away from the first substrate in a shape-following manner, the other part of the second encapsulation portion covers a side of the display substrate adjacent to the opening pattern in a shape-following manner, and an adhesive force between a material of the first buffer layer and a base material of the first step surface is greater than an adhesive force between a material of the second encapsulation portion and the base material of the first step surface.

In a possible embodiment of the present disclosure, the thin film encapsulation layer includes a first inorganic encapsulation layer, a second inorganic encapsulation layer and a first organic encapsulation layer between the first inorganic encapsulation layer and the second inorganic encapsulation layer in a direction away from the base substrate, each of the first inorganic encapsulation layer and the second inorganic encapsulation layer at least covers a side of each of the display unit and the wiring unit away from the base substrate and a surface of the display unit adjacent to the opening pattern, and the first organic encapsulation layer at least covers a side of the display unit away from the base substrate. The stretchable display substrate further includes a second buffer layer, and the second buffer layer covers the first step surface and a side of the first substrate adjacent to the opening pattern in a shape-following manner to increase an adhesive force between the first inorganic encapsulation layer and the second inorganic encapsulation layer.

In a possible embodiment of the present disclosure, a base material of the first step surface includes silicon dioxide, each of the first buffer layer and the second buffer layer is a metal thin film, and an oxide of a metal material of the metal thin film is bound to a silicon oxygen bond of the base material of the first step surface.

In a possible embodiment of the present disclosure, the metal material includes at least one of titanium, aluminium or manganese.

In a possible embodiment of the present disclosure, the display unit includes a first planarization layer covering a side of the second substrate away from the first substrate, a size of an opening in the first planarization layer at a side adjacent to the opening pattern is greater than the opening size of the opening pattern in the second substrate, at least a part of the second substrate away from the first substrate is not covered by the first planarization layer and is provided with a third step-like structure, a region of the second substrate away from the first substrate and not covered by the first planarization layer is a third step surface of the third step-like structure, the first buffer layer covers the third step surface in a shape-following manner, and when a second buffer layer is arranged between the first inorganic encapsulation layer and the second inorganic encapsulation layer, the second buffer layer covers the third step surface in a shape-following manner.

In another aspect, the present disclosure provides in some embodiments a method for manufacturing the above-mentioned stretchable display substrate, including: providing a rigid support plate: forming a base substrate on the rigid support plate, a plurality of opening patterns being distributed on the base substrate, a plurality of bridges being formed between adjacent ones of at least a part of opening patterns in the plurality of opening patterns to define islands, each of at least a part of opening patterns having different opening sizes at a side of the base substrate adjacent to a display unit and a side of the base substrate away from the display unit so that the opening pattern at least forms at least one step-like structure at a side adjacent to the island: forming a plurality of display units and a plurality of wiring units on the base substrate, at least one display unit being arranged on each island, each wiring unit being coupled between the display units on the islands and arranged on the bridge; forming a thin film encapsulation structure, the thin film encapsulation structure covering a side of the display unit away from the base substrate, a side of the display unit adjacent to the opening pattern, a side of the wiring unit away from the base substrate, a side of the wiring unit adjacent to the opening pattern and a side of the base substrate in the opening pattern away from the rigid support plate in a shape-following manner: and peeling the base substrate off from the rigid support plate. A portion of the thin film encapsulation structure covering a side of the wiring unit away from the base substrate, a side of the wiring unit adjacent to the opening pattern and a side of the base substrate in the opening pattern away from the rigid support plate is peeled off to form a thin film encapsulation layer, the thin film encapsulation layer includes a first encapsulation portion covering a side of the display unit away from the base substrate and a second encapsulation portion at least covering a side of the display unit adjacent to the opening pattern, and the second encapsulation portion is used to protect a side of the display unit adjacent to the opening pattern.

In a possible embodiment of the present disclosure, prior to forming the thin film encapsulation structure, the method further includes forming an optically clear adhesive layer on the first step surface, and patterning the optically clear adhesive layer to form a spacer. When forming the thin film encapsulation structure, the thin film encapsulation structure covers a side of the spacer away from a first substrate in a shape-following manner, a third encapsulation portion of the thin film encapsulation structure covering a side of the spacer away from the first substrate is separated from the second encapsulation portion of the thin film encapsulation structure covering a side of the display unit adjacent to the opening pattern through the spacer, and the second encapsulation portion is separated from the portion of the thin film encapsulation structure covering a side of the base substrate in the opening pattern away from the rigid support plate through the spacer.

In a possible embodiment of the present disclosure, when forming the thin film encapsulation structure, the thin film encapsulation structure is interrupted through a segment difference formed by the second step surface.

In a possible embodiment of the present disclosure, the forming the optically clear adhesive layer on the first step surface and patterning the optically clear adhesive layer to form the spacer includes applying a positive or negative photoresist to form the optically clear adhesive layer, and patterning the optically clear adhesive layer through exposing, developing and etching to form the spacer.

In a possible embodiment of the present disclosure, the spacer and a plurality of protrusions are formed through one single patterning process.

In a possible embodiment of the present disclosure, the forming the base substrate on the rigid support plate includes forming the opening patterns on the first substrate and the second substrate through etching.

In a possible embodiment of the present disclosure, prior to forming the thin film encapsulation structure and subsequent to forming the plurality of display units and the plurality of wiring units on the base substrate, the method further includes: forming a first evaporation film layer at a side of the second substrate in the opening pattern away from the first substrate, an adhesive force between the first evaporation film layer and a base material of the second substrate being smaller than an adhesive force between the thin film encapsulation layer and the base material of the second substrate: forming a first buffer layer, the first buffer layer covering the first step-like structure and the third step-like structure in a shape-following manner; forming a first inorganic encapsulation layer, the first inorganic encapsulation layer covering the first buffer layer, a side of the display unit not covered by the first buffer layer and adjacent to the opening pattern, a side of the wiring unit adjacent to the opening pattern, a side of the display unit away from the base substrate and a side of the wiring unit away from the base substrate in a shape-following manner: forming a second buffer layer, the second buffer layer covering the first step-like structure and the third step-like structure in a shape-following manner: forming a first organic encapsulation layer, the first organic encapsulation layer covering a side of the display unit away from the base substrate in a shape-following manner: and forming a second inorganic encapsulation layer, the second inorganic encapsulation layer covering the first buffer layer, a side of the display unit not covered by the first buffer layer and adjacent to the opening pattern, a side of the wiring unit adjacent to the opening pattern, a side of the display unit away from the base substrate and a side of the wiring unit away from the base substrate in a shape-following manner.

In a possible embodiment of the present disclosure, the first evaporation film layer is formed through vacuum evaporation and made of an organic material or a metal material.

In a possible embodiment of the present disclosure, each of the first buffer layer and the second buffer layer is deposited through magnetron-sputtering.

In a possible embodiment of the present disclosure, the first inorganic encapsulation layer is formed through chemical vapor deposition, the second inorganic encapsulation layer is formed through chemical vapor deposition, and the first organic encapsulation layer is formed through ink-jet printing.

The present disclosure has the following beneficial effects.

According to the stretchable display substrate and its manufacturing method in the embodiments of the present disclosure, the opening pattern on the base substrate is provided with at least one step-like structure at a side adjacent to the island (i.e., a side adjacent to the display unit), i.e., the step-like opening pattern is provided. During the manufacture of the stretchable display substrate, when forming the thin film encapsulation layer, the thin film encapsulation layer is interrupted through the step-like structure. When the thin film encapsulation layer at the opening pattern is separated from the rigid support plate through Laser Lift Off (LLO), the thin film encapsulation layer in the opening pattern is peeled off, but the thin film encapsulation layer at a side surface of the display unit above the base substrate is reserved, i.e., not peeled off or damaged. As a result, after the LLO, it is able to prevent the encapsulation of the side surface of the display unit from being adversely affected, thereby to improve the encapsulation reliability and achieve narrow-bezel encapsulation in a better manner than conventional.

DETAILED DESCRIPTION

Figure 1:
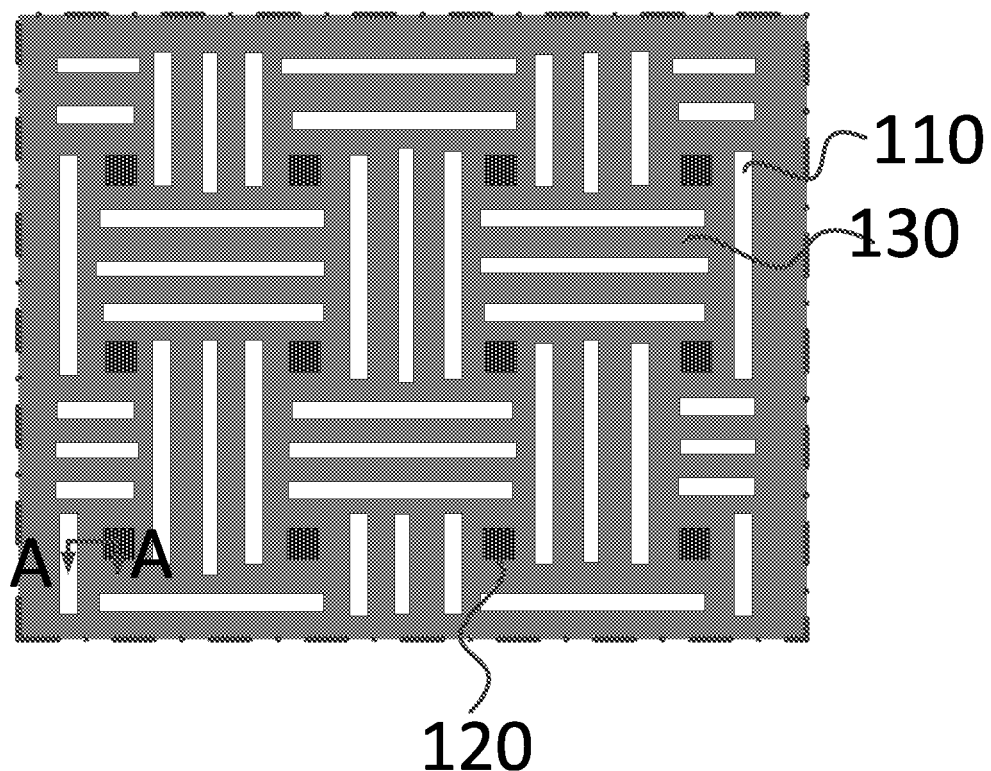
FIG. 1 is a top view of a stretchable display substrate according to one embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Before the description about a stretchable display substrate and its manufacturing method in the embodiments of the present disclosure, the following description about the related art needs to be provided.

In the related art, a stretchable OLED display element mainly includes a plurality of opening patterns, and due to the plurality of opening patterns, a plurality of islands arranged in an array form and spaced apart from each other and a plurality of bridges each connecting the islands are formed on a base substrate. A display unit is arranged on each island, and wiring(s) is(are) arranged on each bridge.

During the manufacture of the stretchable OLED display element, the display unit and the wiring are formed on a rigid support plate (e.g., a glass substrate), and then the stretchable OLED display element subjected to thin film encapsulation. After the formation of a thin film encapsulation layer (a tetrafluoroethylene (TFE) layer), the stretchable OLED display element is peeled off from the rigid support plate through LLO. The thin film encapsulation layer for the opening pattern is tightly adhered to the rigid support plate, and during the LLO, the thin film encapsulation layer at a side surface of the display unit is peeled off, so the encapsulation at the side surface of the display unit is adversely affected. In addition, due to a large stress of the thin film encapsulation layer, the thin film encapsulation layer on the display unit may be damaged after the LLO, i.e., an inorganic layer may be peeled off or damaged. At this time, moisture enters the display element easily from the side surface of the display unit and from above the display element, and thereby the reliability of the display element is adversely affected.

An object of the present disclosure is to provide a stretchable display substrate and its manufacturing method, so as to improve the reliability of the display element.

FIGS. 5, 8, 13 and 14 show illustrative structures of the stretchable display substrate according to one embodiment of the present disclosure.

As shown in FIGS. 5, 8, 13 and 14, the stretchable display substrate in the embodiments of the present disclosure includes a base substrate 100, a plurality of display units 200, a plurality of wiring units 300 and a thin film encapsulation layer 400. A plurality of opening patterns 110 is distributed on the base substrate 100, and a plurality of bridges 130 is formed between adjacent ones of at least a part of opening patterns 110 in the plurality of opening patterns 110 to define islands 120. At least one display unit 200 is arranged on each island 120. Each wiring unit 300 is coupled between the display units 200 on the islands 120 and arranged on the bridge 130. The thin film encapsulation layer 400 includes a first encapsulation portion covering a side of each display unit 200 away from the base substrate 100 and a second encapsulation portion at least covering a side of each display unit 200 adjacent to the opening pattern 110 (i.e., a side surface perpendicular to the base substrate). The second encapsulation portion is used to protect a side of the display unit 200 adjacent to the opening pattern 110. Each of at least a part of opening patterns 110 has different opening sizes at a side of the base substrate 100 adjacent to the display unit 200 and a side of the base substrate 100 away from the display unit 200, the opening pattern 110 has at least one step-like structure at a side adjacent to the island 120, and the thin film encapsulation layer 400 is interrupted at the step-like structure.

According to the stretchable display substrate in the embodiments of the present disclosure, the opening pattern 110 on the base substrate 100 is provided with at least one step-like structure at a side adjacent to the island 120 (i.e., a side adjacent to the display unit 200), i.e., the step-like opening pattern 110 is provided. During the formation of the thin film encapsulation layer 400, the thin film encapsulation layer 400 is interrupted through the step-like structure. When the thin film encapsulation layer 400 at the opening pattern 100 is separated from a rigid support plate 900 through LLO, the thin film encapsulation layer 400 in the opening pattern 110 is peeled off, but the thin film encapsulation layer 400 at a side surface of the display unit 200 above the base substrate is reserved. In other words, the first encapsulation portion covering a side of the display unit 200 away from the base substrate 100 and the second encapsulation portion at least covering a side of the display unit 200 adjacent to the opening pattern 110 are reserved on the stretchable display substrate, but not peeled off or damaged. As a result, after the LLO, it is able to prevent the encapsulation of the side surface of the display unit 200 from being adversely affected, thereby to improve the encapsulation reliability and achieve narrow-bezel encapsulation in a better manner.

In some embodiments of the present disclosure, as shown in FIGS. 5, 8, 13 and 14, the base substrate 100 includes a first substrate 101 and a second substrate 102 arranged at a side of the first substrate 101 adjacent to the display unit 200, and the opening pattern 110 has different opening sizes in the first substrate 101 and the second substrate 102, so as to form the at least one step-like structure.

Based on the above, the base substrate 100 includes at least two layers of substrates. The first substrate 101 is a bottom layer (bottom Polyimide (PI) layer) which includes a first PI film 101 and a first barrier layer 1012. The second substrate 102 is a top PI layer which includes a second PI film 1021 and a barrier layer 1022. During the manufacture of the stretchable display substrate, holes having different sizes are sequentially formed in the two substrates, so as to form the step-like opening pattern 110.

Figure 5:
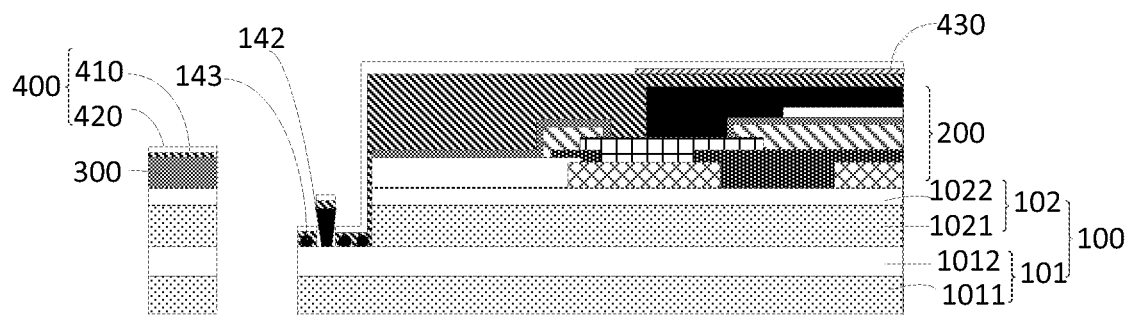
FIG. 5 is a sectional view of the stretchable display substrate along line A-A in FIG. 1.

In some embodiments of the present disclosure, as shown in FIG. 5, the opening size of the opening pattern 110 in the first substrate 101 is smaller than the opening size of the opening pattern 110 in the second substrate 102. Put it another way, the opening size of the top PI layer is greater than that of the bottom PI layer. In this way, at least a part of the first substrate 101 adjacent to the second substrate 102 is not covered by the second substrate 102 to form a first step-like structure 141, and a region of the first substrate 101 adjacent to the second substrate 102 and not covered by the second substrate 102 is a first step surface 141a of the first step-like structure 141. A spacer 142 is arranged on the first step surface 141a, a third encapsulation portion is arranged at a side of the spacer 142 away from the first substrate 101, and the third encapsulation portion is separated from the second encapsulation portion through the spacer 142.

In the embodiments of the present disclosure, the spacer 142 is arranged on the first step surface 141a of the first step-like structure 141 so as to interrupt the thin film encapsulation layer 400. In this way, the thin film encapsulation layer 400 at two opposite sides of a bottom of the spacer 142 on the first step surface 141a is interrupted. After the LLO, the thin film encapsulation layer 400 on the first step surface 141a at a side of the spacer 142 away from the display unit 200 (i.e., an outer side of the spacer 142) is peeled off, while the thin film encapsulation layer 400 on the first step surface 141a at a side of the spacer 142 adjacent to the display unit 200 (i.e., an inner side of the spacer 142), the thin film encapsulation layer 400 above the second substrate 102 and at a side of the display unit 200 (i.e., the second encapsulation portion) and the thin film encapsulation layer 400 on the display unit are reserved well, i.e., not peeled off or damaged.

In addition, in the embodiments of the present disclosure, a specific structure of the spacer 142 will not be particularly defined herein, as long as the thin film encapsulation layer 400 is interrupted through the spacer 142.

For example, in some embodiments of the present disclosure, the spacer 142 includes a continuous spacer 142 extending in a first direction, and the first direction is an extension direction of a boundary between the island 120 and the opening pattern 110.

It should be appreciated that, as shown in FIG. 1, the opening pattern 110 is of a strip-like shape, the boundary between the opening pattern and the island is a straight line, and the first direction is just the extension direction of the boundary, i.e., the extension direction of the straight line. In some other embodiments of the present disclosure, the opening pattern is of a curve-like shape, e.g., an elliptical or circular shape, the boundary between the opening pattern and the island is an arc-like curve, and the first direction is the extension direction of the arc-like curve.

In some other embodiments of the present disclosure, the spacer 142 includes discrete spacers 142 arranged in at least one row in a direction away from the display unit, the discrete spacers 142 in each row include a plurality of discrete spacers 142 spaced apart from each other in the first direction. The discrete spacers 142 in merely one row are shown in FIG. 5 as an example for illustrative purpose only.

In addition, as shown in FIG. 5, a sectional shape of the spacer 142 is an inverted-trapezoidal shape in a direction perpendicular to the base substrate 100, and a length of a bottom edge of the spacer 142 at a side away from the base substrate is greater than a length of a bottom edge of the spacer 142 at a side adjacent to the base substrate. In this way, during the thin film encapsulation, the thin film encapsulation layer 400 is interrupted at the bottom of the spacer 142.

Of course, it should be appreciated that, the sectional shape of the spacer 142 may also be an inverted-triangular shape, i.e., a specific shape of the spacer 142 will not be particularly defined herein.

In addition, in some embodiments of the present disclosure, as shown in FIG. 5, the first step surface 141a is provided with a plurality of protrusions 143 at the at least one of a side of the spacer 142 adjacent to the opening pattern 110 and a side of the spacer 142 away from the opening pattern 110, and a height of each protrusion 143 in a direction perpendicular to the first substrate 101 is smaller than a height of the spacer 142 in the direction perpendicular to the first substrate 101. Each protrusion 143 is provided with a snow-like, spherical or net-like pattern.

In this way, through the plurality of protrusions 143 on the first step surface 141a of the first step-like structure 141, when the thin film encapsulation layer 400 is deposited on the first step surface 141a, it is able to increase a nucleation density of a thin film, reduce the quantity of gaps at an interface of the thin film and increase the adhesion between the thin film and a base material of the first step surface 141a, thereby to reserve the thin film encapsulation layer 400 at the side surface of the display unit 200 after the LLO.

Figure 8:
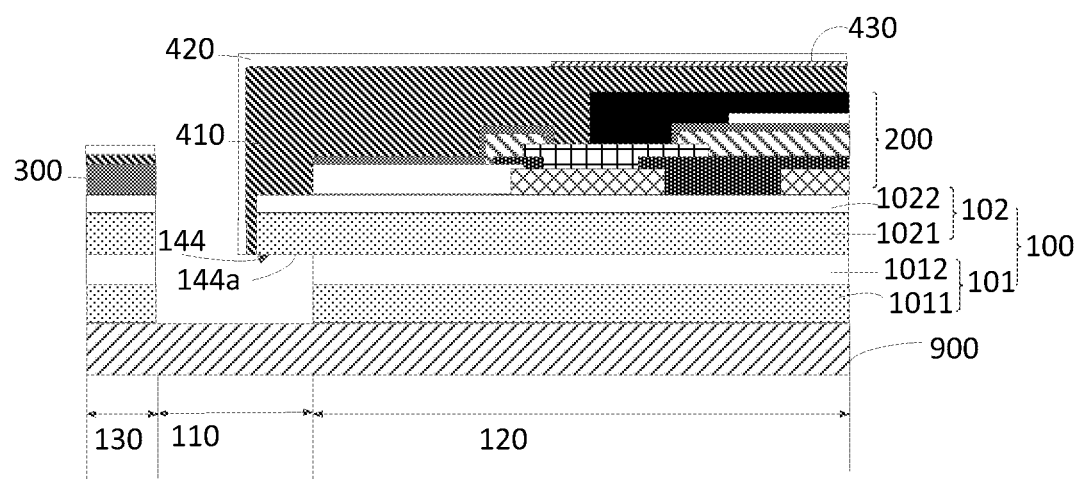
FIG. 8 is another sectional view of the stretchable display substrate along line A-A in FIG. 1 according to one embodiment of the present disclosure.
Figure 9:
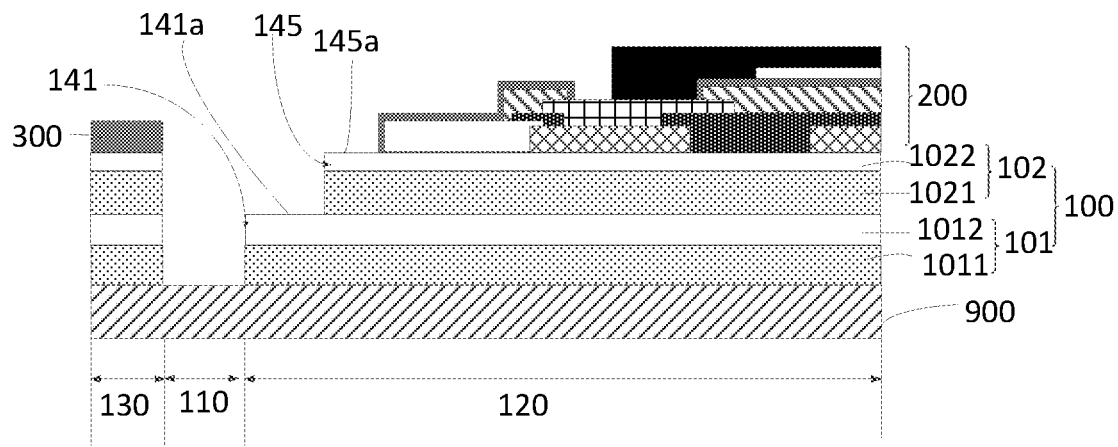
FIG. 9 is another schematic view showing the structure of the stretchable display substrate in Step S03 according to one embodiment of the present disclosure.

In the embodiments of the present disclosure, the opening pattern 110 is wide at the top and narrow at the bottom, so as to form the at least one step-like structure. In some other embodiments of the present disclosure, as shown in FIG. 8, the opening size of the opening pattern 110 in the first substrate 101 is greater than the opening size of the opening pattern 110 in the second substrate 102, so that at least a part of the second substrate 102 adjacent to the first substrate 101 does not overlap the first substrate 101 to form a second step-like structure 144, i.e., the opening size of the opening pattern in the top PI layer is greater than the opening size of the opening pattern in the bottom PI layer to form an undercut structure that is narrow at the top but wide at the bottom as shown in FIG. 8. A region of the second substrate 102 adjacent to the first substrate 101 and not overlapping the first substrate 101 is a second step surface 144a of the second step-like structure 144, and the second encapsulation portion is interrupted at the second step surface 144a.

In the embodiments of the present disclosure, due to the undercut structure in the opening pattern 110, the thin film encapsulation layer 400 is interrupted through a segment difference formed by the second step surface 144a during the thin film encapsulation, so as to prevent the thin film encapsulation layer 400 at the side surface of the display unit 200 from being peeled off during the LLO.

Figure 13:
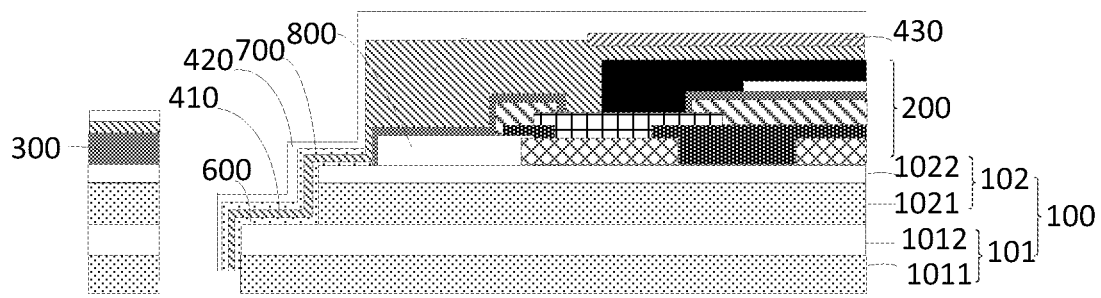
FIG. 13 is yet another sectional view of the stretchable display substrate along line A-A in FIG. 1 according to one embodiment of the present disclosure.

In addition, in some embodiments of the present disclosure, as shown in FIG. 13, the opening size of the opening pattern 110 in the first substrate 101 is smaller than the opening size of the opening pattern 110 in the second substrate 102, so that at least a part of the first substrate 101 adjacent to the second substrate 102 is not covered by the second substrate 102 to form the first step-like structure 141, and a region of the first substrate 101 adjacent to the second substrate 102 and not covered by the second substrate 102 is the first step surface 141a of the first step-like structure 141. The stretchable display substrate further includes a first buffer layer 600, the first buffer layer 600 covers the first step surface 141a and a side of the first substrate 101 adjacent to the opening pattern 110 in a shape-following manner, a part of the second encapsulation portion covers a side of the first buffer layer 600 away from the first substrate 101 in a shape-following manner, the other part of the second encapsulation portion covers a side of the display substrate adjacent to the opening pattern 110 in a shape-following manner, and an adhesive force between a material of the first buffer layer 600 and a base material of the first step surface 141a is greater than an adhesive force between a material of the second encapsulation portion and the base material of the first step surface 141a.

Based on the above, during the manufacture of the stretchable display substrate, at the beginning, openings are formed in the two substrates in such a manner that the opening size in the top PI layer is greater than the opening size in the bottom PI layer. At least a part of the first substrate 101 at a side adjacent to the second substrate 102 is not covered by the second substrate 102 to form the first step-like structure 141, and the region of the first substrate 101 at a side adjacent to the second substrate 102 and not covered by the second substrate 102 is the first step surface 141a of the first step-like structure 141. Next, before the thin film encapsulation, a first evaporation film layer 910 is formed on the second substrate 102 in the opening pattern 110 at a side away from the first substrate 101, and an adhesive force between the first evaporation film layer 910 and a base material of the second substrate 102 is smaller than an adhesive force between the thin film encapsulation layer 400 and the base material of the second substrate 102. Next, the first buffer layer 600 is formed in such a manner so as to cover the first step-like structure 141 in a shape-following manner. Then, the thin film encapsulation layer 400 is formed on the first buffer layer 600.

The first evaporation film layer 910 is formed through evaporation, and it is made of an organic material or a metal material, so an adhesive force between the first evaporation film layer 910 obtained through vacuum evaporation and the rigid support plate 900 is very small. In addition, the first buffer layer 600 is formed at the first step-like structure 141 before the thin film encapsulation, and the adhesive force between the first buffer layer 600 and the first step surface 141a is very strong. In this way, during the LLO, the first evaporation film layer 910 and the layer thereabove are easily peeled off at the opening pattern 110, but the thin film encapsulation layer 400 at the first step-like structure 141 is not peeled off, so as to ensure the complete thin film encapsulation layer 400 at the side surface of the display unit 200.

It should be appreciated that, the adhesive force is remarkably affected by properties of the base material and the material of the thin film. In order to attach the first buffer layer 600 firmly, charge transfer needs to occur during the deposition of the thin film. Hence, in some embodiments of the present disclosure, the base material of the first step surface 141*a* is silicon dioxide ($SiO_2$). The first buffer layer 600 is made of a metal material through magnetron-sputtering, e.g., the first buffer layer 600 is made of at least one of titanium, aluminium or manganese, i.e., the first buffer layer 600 is a titanium film, an aluminium film or a manganese film deposited on a $SiO_2$ thin film, so the adhesive force is very strong. The $SiO_2$ thin film includes oxygen molecules or ions, and an oxide generated by the metal material of the first buffer layer 600 is bound to a silicon oxygen bond in the base material in a better manner due to chemisorption, so the adhesion of the metal thin film containing easily-oxidized elements is much greater than the adhesion of the metal thin film not containing the easily-oxidized elements.

In addition, in some embodiments of the present disclosure, as shown in FIG. 13, the thin film encapsulation layer 400 includes a first inorganic encapsulation layer 410, a second inorganic encapsulation layer 420 and a first organic encapsulation layer 430 between the first inorganic encapsulation layer 410 and the second inorganic encapsulation layer 420 in a direction away from the base substrate. Each of the first inorganic encapsulation layer 410 and the second inorganic encapsulation layer 420 at least covers a side of each of the display unit and the wiring unit away from the base substrate and a surface of the display unit adjacent to the opening pattern, and the first organic encapsulation layer at least covers a side of the display unit away from the base substrate. The two inorganic layers of the thin film encapsulation layer 400 do not match well at the step-like structure, the adhesion of the thin film is poor due to a too large stress of the thin film itself, and a stress in the film layer is too large, so the inorganic layers of the thin film encapsulation layer 400 are easily peeled off during the LLO. Hence, in some embodiments of the present disclosure, the stretchable display substrate further includes a second buffer layer 700, and the second buffer layer 700 covers the first step surface and a side of the first substrate adjacent to the opening pattern in a shape-following manner to increase an adhesive force between the first inorganic encapsulation layer 410 and the second inorganic encapsulation layer 420.

Each of the first buffer layer 600 and the second buffer layer 700 is a metal thin film, and an oxide generated by the metal material of the metal thin film is bound to the silicon oxygen bond in the base material of the first step surface 141*a*. In this way, it is able to, on one hand, increase the adhesive force between the two inorganic layers of the thin film encapsulation layer, and on the other hand, reduce the stress in the inorganic layers of the thin film encapsulation layer 400 at the step-like structure, thereby to release the stress in the inorganic layers. The metal film layer has excellent ductility, so it is able to reduce the influence caused when the stresses in the inorganic layers do not match, thereby to increase the adhesive force between the inorganic layers.

In addition, when the first buffer layer 600 and the second buffer layer 700 are formed at the step-like structure, the light transmittance of the display unit 200 of the stretchable display substrate is not adversely affected, so it is able to ensure the luminous efficiency of the display unit 200 of the display substrate.

In the above description, merely one step-like structure is provided at the opening pattern 110. As shown in FIG. 13, two or more step-like structures are provided at the opening pattern 110.

In a possible embodiment of the present disclosure, as shown in FIG. 13, the display unit 200 includes a first planarization layer 800 covering a side of the second substrate 102 away from the first substrate 101. The opening size of the opening pattern 110 in the first substrate 101 is smaller than the opening size of the opening pattern 110 in the second substrate 102, i.e., the opening size in the top PI layer is greater than the opening size in the bottom PI layer. Hence, at least a part of the first substrate 101 at a side adjacent to the second substrate 102 is not covered by the second substrate 102 to form the first step-like structure 141, and the region of the first substrate 101 at a side adjacent to the second substrate 102 and not covered by the second substrate 102 is the first step surface 141*a* of the first step-like structure 141.

A size of an opening in the first planarization layer 800 at a side adjacent to the opening pattern 110 is greater than the opening size of the opening pattern 110 in the second substrate 102, so that at least a part of the second substrate 102 away from the first substrate 101 is not covered by the first planarization layer 800 and is provided with a third step-like structure 145. A region of the second substrate 102 away from the first substrate 101 and not covered by the first planarization layer 800 is a third step surface 145*a* of the third step-like structure 145, and the first buffer layer 600 covers the third step surface 145*a* in a shape-following manner.

The first buffer layer 600 covers the first step surface 141*a*, the third step surface 145*a*, and a side of the first substrate 101 adjacent to the opening pattern 110 in a shape-following manner. A part of the second encapsulation portion covers a side of the first buffer layer 600 away from the first substrate 101 in a shape-following manner, and the other part covers a size of the display substrate adjacent to the opening pattern 110. An adhesive force between the material of the first buffer layer 600 and the base material of the first step surface 141*a* is greater than an adhesive force between the material of the second encapsulation portion and the base material of the first step surface 141*a*.

A second buffer layer 700 is further arranged between the first inorganic encapsulation layer 410 and the second inorganic encapsulation layer 420, the second buffer layer 700 covers the first step surface 141*a*, the third step surface 145*a* and a side of the first substrate 101 adjacent to the opening pattern in a shape-following manner.

Figure 14:
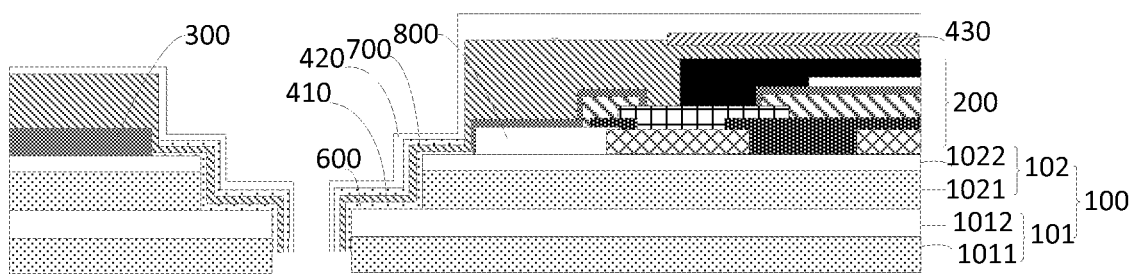
FIG. 14 is still yet another sectional view of the stretchable display substrate along line A-A in FIG. 1 according to one embodiment of the present disclosure.

It should be appreciated that, in the embodiments of the present disclosure, the at least one step-like structure is formed at a side of the opening pattern 110 adjacent to the island 120. In some other embodiments of the present disclosure, at least one step-like structure may also be formed at a side of the opening pattern 110 adjacent to the bridge 130. For example, as shown in FIG. 14, at least two step-like structures are arranged at a side of the opening pattern 110 adjacent to the island 120, and at least two step-like structures are arranged at a side of the opening pattern 110 adjacent to the bridge 130.

The stretchable display substrate in the embodiments of the present disclosure is applied to various display devices. Hence, the present disclosure further provides in some embodiments a display device including the above-mentioned stretchable display substrate. The display device may be any product or member having a display function, e.g., mobile phone, tablet computer, television, display, laptop computer, digital photo frame or navigator.

FIGS. 2 to 14 partially show the manufacture of the stretchable display substrate in the embodiments of the present disclosure, i.e., the stretchable display substrate may be manufactured with reference to steps in FIGS. 2 to 14.

The present disclosure further provides in some embodiments a method for manufacturing the stretchable display substrate, which includes the following steps.

Step S01: providing the rigid support plate 900.

The rigid support plate 900 is made of a rigid material, e.g., glass.

Step S02: forming the base substrate 100 on the rigid support plate 900, the plurality of opening patterns 110 being distributed on the base substrate 100, the plurality of bridges 130 being formed between adjacent ones of at least a part of opening patterns 110 in the plurality of opening patterns 110 to define the islands 120, each of at least a part of opening patterns 110 having different opening sizes at a side of the base substrate 100 adjacent to the display unit 200 and a side of the base substrate 100 away from the display unit 200, so that the opening pattern 110 at least forms at least one step-like structure at a side adjacent to the island 120.

The base substrate 100 is single-layered or multi-layered flexible base substrate. For example, in some embodiments of the present disclosure, the base substrate 100 includes at least two layers of flexible substrates, e.g., the first substrate 101 and the second substrate 102. The first substrate 101 is a bottom layer (bottom Polyimide (PI) layer) which includes a first PI film 101 and a first barrier layer 1012. The second substrate 102 is a top PI layer which includes a second PI film 1021 and a barrier layer 1022. The opening pattern 110 on the base substrate 100 is formed through a patterning process, e.g., etching. As shown in FIGS. 5, 8, 13 and 14, the forming the base substrate on the rigid support plate specifically includes forming the opening patterns 110 on the first substrate 101 and the second substrate 102 through etching.

Step S03: forming the plurality of display units 200 and the plurality of wiring units 300 on the base substrate 100, at least one display unit 200 being arranged on each island 120, each wiring unit 300 being coupled between the display units 200 on the islands 120 and arranged on the bridge 130.

The plurality of display units 200 includes thin film transistor (TFT) driving circuitries or light-emitting elements. For example, when the stretchable display substrate is an OLED display substrate, the light-emitting element includes a cathode, an anode and an organic light-emitting layer between the cathode and the anode. The plurality of wiring units 300 includes such signal lines as gate lines and data lines. The manufacture of the display units 200 and the wiring units 300 may refer to an existing process for manufacturing a TFT back plate, and thus will not be particularly defined herein.

Step S04: forming the thin film encapsulation structure, the thin film encapsulation structure covering a side of the display unit 200 away from the base substrate 100, a side of the display unit 200 adjacent to the opening pattern 110, a side of the wiring unit 300 away from the base substrate 100, a side of the wiring unit 300 adjacent to the opening pattern 110 and a side of the base substrate 100 in the opening pattern 110 away from the rigid support plate 900 in a shape-following manner.

For example, the thin film encapsulation structure includes the first inorganic encapsulation layer 410, the second inorganic encapsulation layer 420 and the first organic encapsulation layer 430. The first inorganic encapsulation layer 410 and the second inorganic encapsulation layer 420 are formed through chemical vapor deposition, the first inorganic encapsulation layer 410 is made of silicon nitride or silicon oxynitride, and the first organic encapsulation layer 430 is formed through ink-jet printing.

Step S05: peeling the base substrate off from the rigid support plate 900. The thin film encapsulation layer 400 is interrupted at the step-like structure, so a portion of the thin film encapsulation structure covering a side of the wiring unit 300 away from the base substrate 100, a side of the wiring unit 300 adjacent to the opening pattern 110 and a side of the base substrate 100 in the opening pattern 110 away from the rigid support plate 900 is peeled off, and the reserved thin film encapsulation structure forms the thin film encapsulation layer 400. The thin film encapsulation layer 400 includes the first encapsulation portion covering a side of the display unit 200 away from the base substrate 100 and the second encapsulation portion at least covering a side of the display unit 200 adjacent to the opening pattern 110, and the second encapsulation portion is used to protect a side of the display unit 200 adjacent to the opening pattern 110.

Based on the above, the opening pattern 110 on the base substrate 100 is provided with at least one step-like structure at a side adjacent to the island 120 (i.e., a side adjacent to the display unit 200), i.e., the step-like opening pattern 110 is provided. During the formation of the thin film encapsulation layer 400, the thin film encapsulation layer 400 is interrupted through the step-like structure. When the thin film encapsulation layer 400 at the opening pattern 110 is separated from a rigid support plate 900 through LLO, the thin film encapsulation layer 400 in the opening pattern 110 is peeled off, but the thin film encapsulation layer 400 at a side surface of the display unit 200 above the base substrate is reserved. In other words, the first encapsulation portion covering a side of the display unit 200 away from the base substrate 100 and the second encapsulation portion at least covering a side of the display unit 200 adjacent to the opening pattern 110 are reserved well on the stretchable display substrate, but not peeled off or damaged. As a result, after the LLO, it is able to prevent the encapsulation of the side surface of the display unit 200 from being adversely affected, thereby to improve the encapsulation reliability and achieve narrow-bezel encapsulation in a better manner than conventional.

Figure 2:
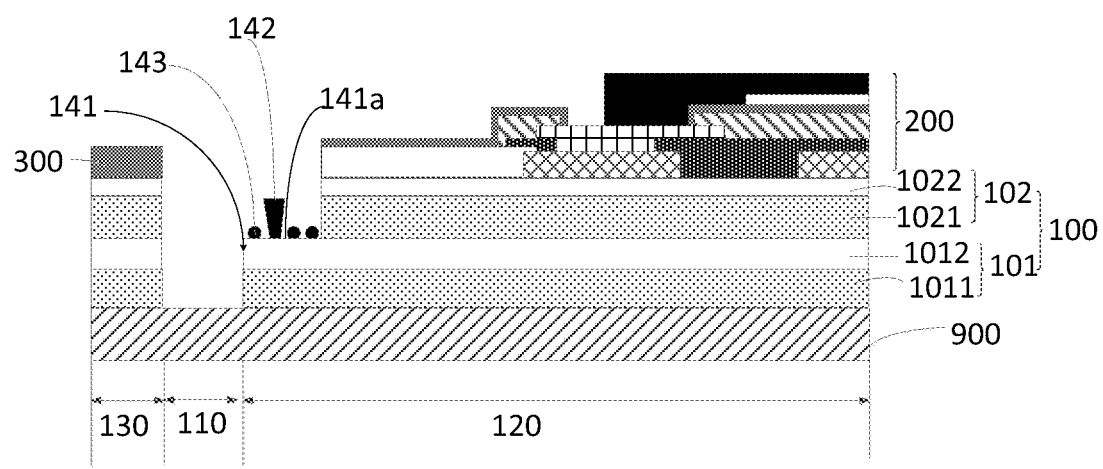
FIG. 2 is a schematic view showing a structure of the stretchable display substrate in Step S031 according to one embodiment of the present disclosure.
Figure 3:
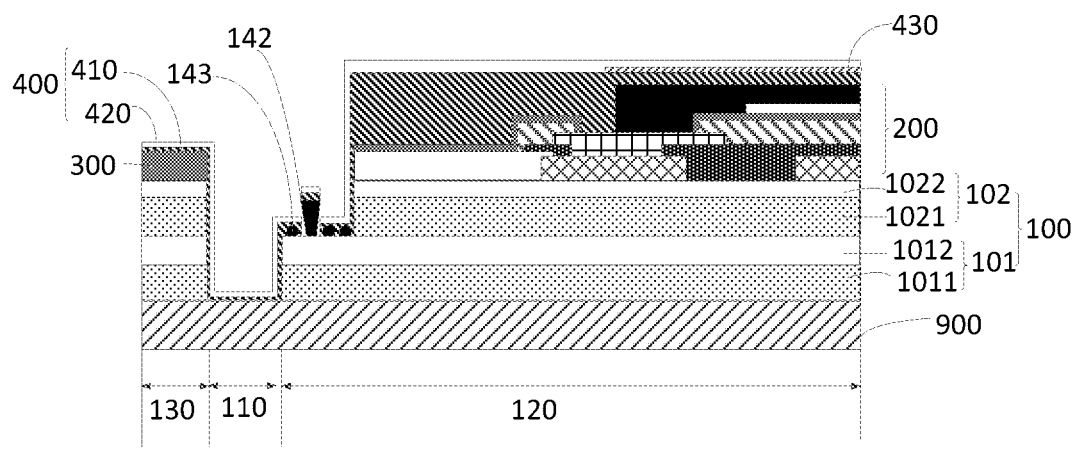
FIG. 3 is a schematic view showing the structure of the stretchable display substrate in Step S04 according to one embodiment of the present disclosure.
Figure 4:
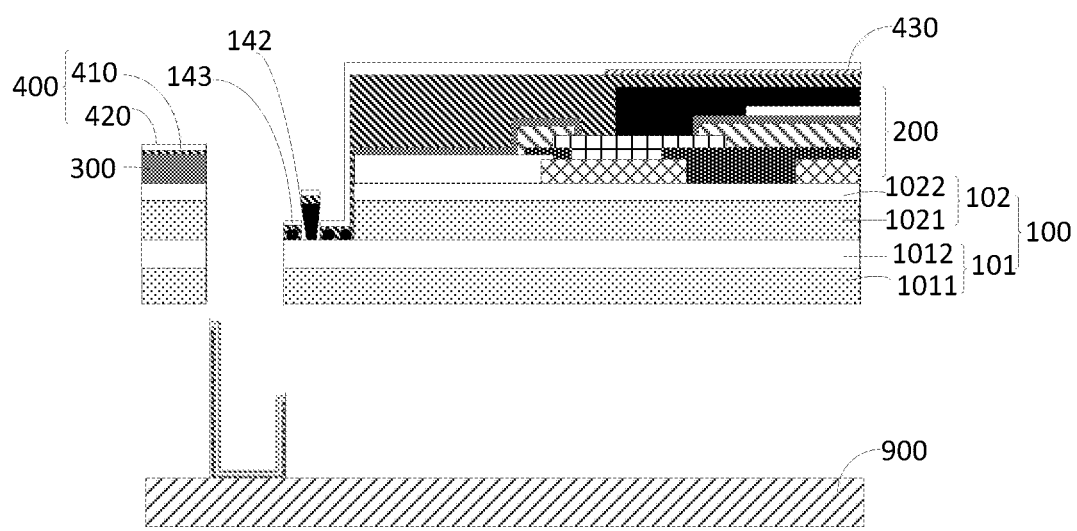
FIG. 4 is schematic view showing the structure of the stretchable display substrate in Step S05 according to one embodiment of the present disclosure.

In some embodiments of the present disclosure, FIGS. 2 to 5 show the manufacture of the stretchable display substrate in FIG. 4.

As shown in FIGS. 2 to 5, prior to Step S04, the method further includes Step S031 of forming an optically clear adhesive layer on the first step surface 141*a*, and patterning the optically clear adhesive layer to form the spacer 142, so as to obtain the display substrate in FIG. 2.

In Step S031, the spacer 142 is formed on the first step surface 141*a* through patterning an optically clear adhesive. For example, the optically clear adhesive layer is made of a positive photoresist or a negative photoresist, and it is patterned through exposing, developing and etching to form the spacer 142. Of course, it should be appreciated that, in actual use, a specific process for forming the spacer 142 is not limited thereto.

In addition, during the manufacture of the stretchable display substrate in FIG. 5, in Step S04, as shown in FIG. 3, when forming the thin film encapsulation structure, the thin film encapsulation structure covers a side of the spacer 142 away from the first substrate 101 in a shape-following manner, the third encapsulation portion of the thin film encapsulation structure covering a side of the spacer 142 away from the first substrate 101 is separated from the second encapsulation portion of the thin film encapsulation structure covering a side of the display unit 200 adjacent to the opening pattern 110 through the spacer 142, and the second encapsulation portion is separated from the portion of the thin film encapsulation structure covering a side of the base substrate 100 in the opening pattern 110 away from the rigid support plate 900 through the spacer 142. Hence, as shown in FIG. 4, during the LLO, the thin film encapsulation layer 400 at a side of the display unit 200 adjacent to the opening pattern 110 are well reserved.

In the embodiments of the present disclosure, the spacer 142 is arranged on the first step surface 141a of the first step-like structure 141 so as to interrupt the thin film encapsulation layer 400. In this way, the thin film encapsulation layer 400 at two opposite sides of a bottom of the spacer 142 on the first step surface 141a is interrupted. After the LLO, the thin film encapsulation layer 400 on the first step surface 141a at a side of the spacer 142 away from the display unit 200 (i.e., an outer side of the spacer 142) is peeled off, while the thin film encapsulation layer 400 on the first step surface 141a at a side of the spacer 142 adjacent to the display unit 200 (i.e., an inner side of the spacer 142), the thin film encapsulation layer 400 above the second substrate 102 and at a side of the display unit 200 (i.e., the second encapsulation portion) and the thin film encapsulation layer 400 on the display unit (i.e., the first encapsulation portion) are reserved, i.e., not peeled off or damaged.

In addition, in the embodiments of the present disclosure, a specific structure of the spacer 142 will not be particularly defined herein, as long as the thin film encapsulation layer 400 is interrupted through the spacer 142.

For example, in some embodiments of the present disclosure, the spacer 142 includes a continuous spacer 142 extending in a first direction, and the first direction is an extension direction of a boundary between the island 120 and the opening pattern 110.

In some other embodiments of the present disclosure, the spacer 142 includes discrete spacers 142 arranged in at least one row in a direction away from the display unit, the discrete spacers 142 in each row include a plurality of discrete spacers 142 spaced apart from each other in the first direction. The discrete spacers 142 in merely one row are shown in FIG. 5, as an example for illustrative purpose only.

In addition, as shown in FIGS. 2 to 5, a sectional shape of the spacer 142 is an inverted-trapezoidal shape in a direction perpendicular to the base substrate 100, and a length of a bottom edge of the spacer 142 at a side away from the base substrate is greater than a length of a bottom edge of the spacer 142 at a side adjacent to the base substrate. In this way, during the thin film encapsulation, the thin film encapsulation layer 400 is interrupted at the bottom of the spacer 142.

Of course, it should be appreciated that, the sectional shape of the spacer 142 may also be an inverted-triangular shape, i.e., a specific shape of the spacer 142 will not be particularly defined herein.

It should be appreciated that, the specific shape of the spacer 142 may be obtained through a patterning process.

In addition, as shown in FIGS. 2 to 5, during the manufacture of the stretchable display substrate in FIG. 5, the plurality of protrusions is formed through exposing, developing and etching. To be specific, in Step S031, the spacer and the plurality of protrusions are formed through one single patterning process, i.e., the plurality of protrusions 143 is formed while forming the spacer 142. Each protrusion 143 is of a snow-like, spherical or net-like pattern. Of course, it should be appreciated that, the plurality of protrusions may also be formed through any other patterning process, which will not be particularly defined herein.

In this way, through the plurality of protrusions 143 on the first step surface 141a of the first step-like structure 141, when the thin film encapsulation layer 400 is deposited on the first step surface 141a, it is able to increase a nucleation density of a thin film, reduce the quantity of gaps at an interface of the thin film and increase the adhesion between the thin film and a base material of the first step surface 141a, thereby to reserve the thin film encapsulation layer 400 at the side surface of the display unit 200 after the LLO.

Figure 6:
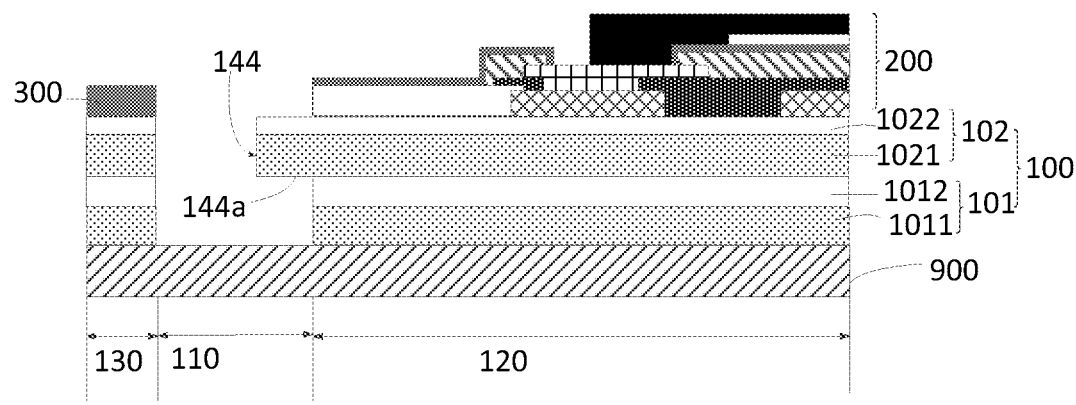
FIG. 6 is a schematic view showing the structure of the stretchable display substrate in Step S03 according to one embodiment of the present disclosure.
Figure 7:
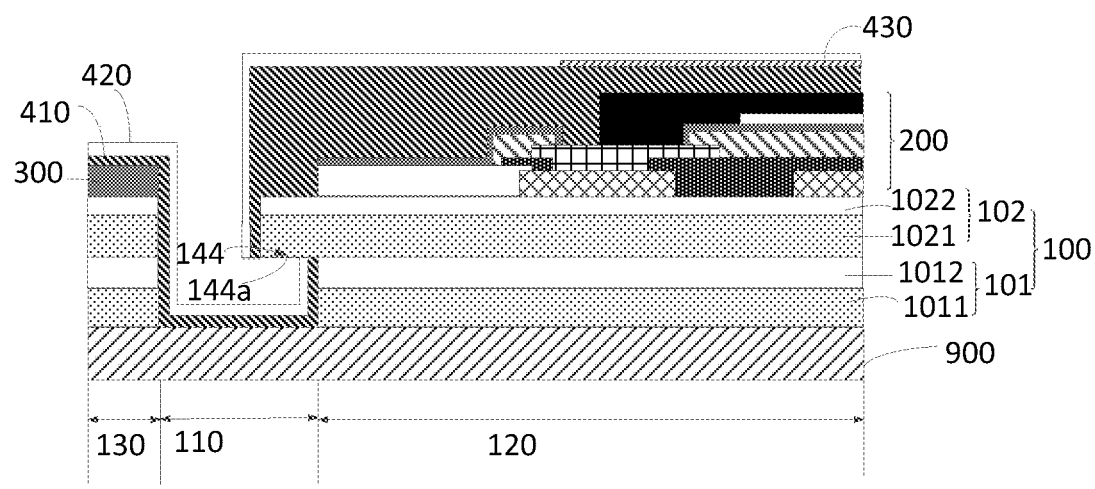
FIG. 7 is another schematic view showing the structure of the stretchable display substrate in Step S04 according to one embodiment of the present disclosure.

In some other embodiments of the present disclosure, FIGS. 6 to 8 show the manufacture of the stretchable display substrate in FIG. 8. During the manufacture of the stretchable display substrate in FIG. 8, as shown in FIGS. 7 and 8, in Step S04, the thin film encapsulation structure is interrupted through a segment difference formed by the second step surface 144a.

In the embodiments of the present disclosure, due to the undercut structure in the opening pattern 110, as shown in FIGS. 7 and 8, the thin film encapsulation layer 400 is interrupted through a segment difference formed by the second step surface 144a during the thin film encapsulation, so as to prevent the thin film encapsulation layer 400 at the side surface of the display unit 200 from being peeled off during the LLO.

In addition, FIGS. 9 to 13 show the manufacture of the stretchable display substrate in FIG. 13. As shown in FIGS. 9 to 13, during the manufacture of the stretchable display substrate in FIG. 13, the method further includes the following steps.

Figure 10:
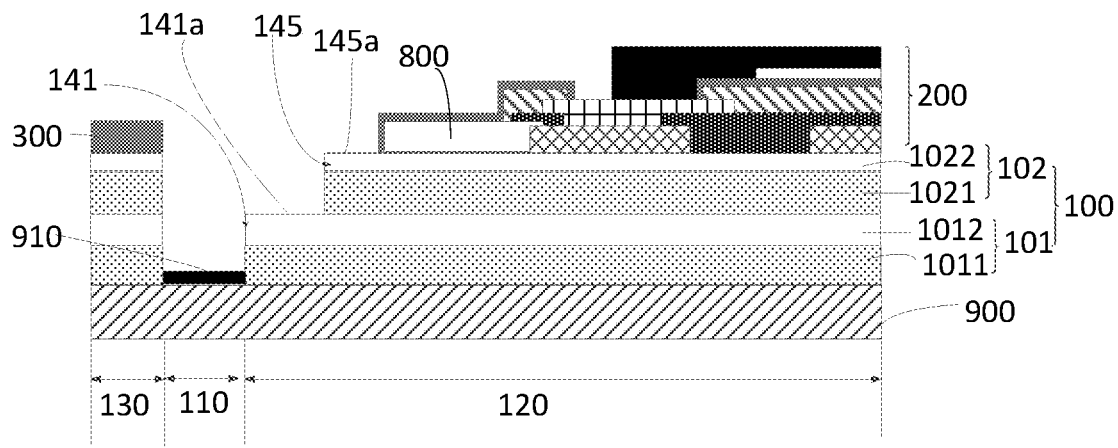
FIG. 10 is yet another schematic view showing the structure of the stretchable display substrate in Step S031 according to one embodiment of the present disclosure.

Step S031: as shown in FIG. 10, forming the first evaporation film layer 910 at a side of the second substrate 102 in the opening pattern away from the first substrate 101, an adhesive force between the first evaporation film layer 910 and a base material of the second substrate 102 being smaller than an adhesive force between the thin film encapsulation layer 910 and the base material of the second substrate 102.

Figure 11:
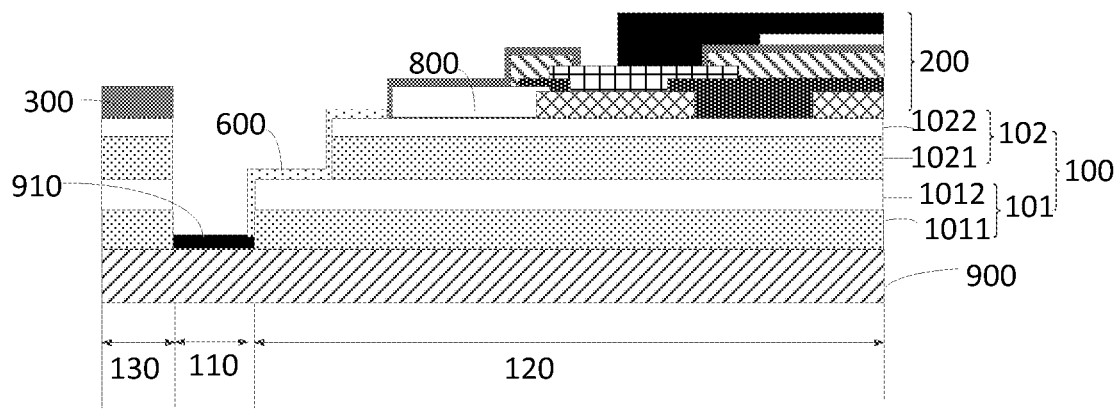
FIG. 11 is a schematic view showing the structure of the stretchable display substrate in Step S032 according to one embodiment of the present disclosure.

Step S032: as shown in FIG. 11, forming the first buffer layer 600, the first buffer layer 600 covering the first step-like structure 141 and the third step-like structure 145 in a shape-following manner.

Figure 12:
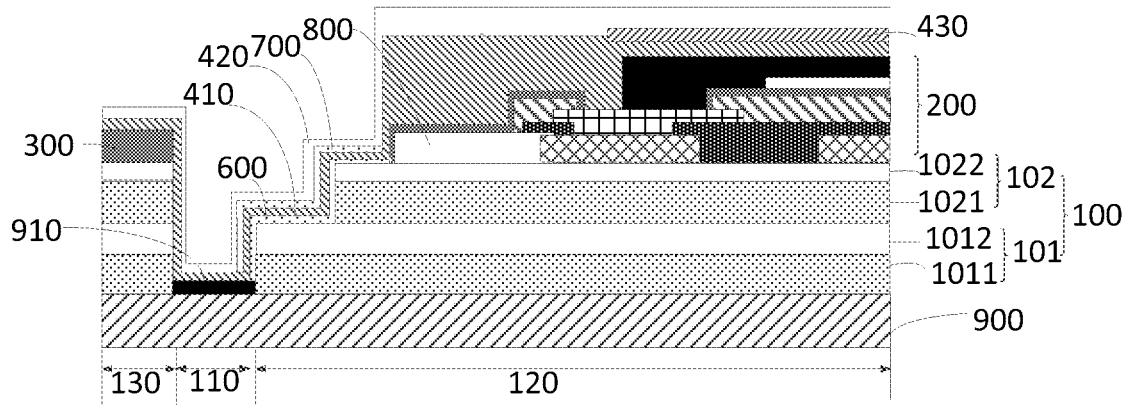
FIG. 12 is yet another schematic view showing the structure of the stretchable display substrate in Step S04 according to one embodiment of the present disclosure.

As shown in FIG. 12, Step S04 includes: Step S041 of forming the first inorganic encapsulation layer, the first inorganic encapsulation layer covering the first buffer layer 600, a side of the display unit 200 not covered by the first buffer layer 600 and adjacent to the opening pattern 110, a side of the wiring unit 300 adjacent to the opening pattern 110, a side of the display unit 200 away from the base substrate and a side of the wiring unit 300 away from the base substrate in a shape-following manner: Step S042 of forming a second buffer layer 700, the second buffer layer 700 covering the first step-like structure 141 and the third step-like structure 145 in a shape-following manner: Step S043 of forming the first organic encapsulation layer 430, the first organic encapsulation layer 430 covering a side of the display unit 200 away from the base substrate in a shape-following manner: and Step S044 of forming the second inorganic encapsulation layer 420, the second inorganic encapsulation layer 420 covering the first buffer layer 600, a side of the display unit 200 not covered by the first buffer layer 600 and adjacent to the opening pattern 110, a side of the wiring unit 300 adjacent to the opening pattern 110, a side of the display unit 200 away from the base substrate and a side of the wiring unit 300 away from the base substrate in a shape-following manner.

In addition, in some embodiments of the present disclosure, the first evaporation film layer 910 is made of an organic material or a metal material and formed through vacuum evaporation. The first buffer layer 600 and the second buffer layer 700 are deposited through magnetron-sputtering.

In some embodiments of the present disclosure, the base material of the first step surface 141*a* is silicon dioxide ($SiO_2$). The first buffer layer 600 is made of a metal material through magnetron-sputtering, e.g., the first buffer layer 600 is made of at least one of titanium, aluminium or manganese, i.e., the first buffer layer 600 is a titanium film, an aluminium film or a manganese film deposited on a $SiO_2$ thin film, so the adhesive force is very strong. The $SiO_2$ thin film includes oxygen molecules or ions, and an oxide generated by the metal material of the first buffer layer 600 is bound to a silicon oxygen bond in the base material in a better manner due to chemisorption, so the adhesion of the metal thin film containing easily-oxidized elements is much greater than the adhesion of the metal thin film not containing the easily-oxidized elements.

Each of the first buffer layer 600 and the second buffer layer 700 is a metal thin film, and an oxide generated by the metal material of the metal thin film is bound to the silicon oxygen bond in the base material of the first step surface 141*a*. In this way, it is able to, on one hand, increase the adhesive force between the two inorganic layers of the thin film encapsulation layer, and on the other hand, reduce the stress in the inorganic layers of the thin film encapsulation layer 400 at the step-like structure, thereby to release the stress in the inorganic layers. The metal film layer has excellent ductility, so it is able to reduce the influence caused when the stresses in the inorganic layers do not match, thereby to increase the adhesive force between the inorganic layers.

In addition, when the first buffer layer 600 and the second buffer layer 700 are formed at the step-like structure, the light transmittance of the display unit 200 of the stretchable display substrate is not adversely affected, so it is able to ensure the luminous efficiency of the display unit 200 of the display substrate.

Some description will be given as follows.
(1) The drawings merely relate to structures involved in the embodiments of the present disclosure, and the other structures may refer to those known in the art.
(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.
(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:
1. A stretchable display substrate, comprising:
a base substrate, a plurality of opening patterns being distributed on the base substrate, a plurality of bridges being formed between adjacent ones of at least a part of opening patterns in the plurality of opening patterns to define islands;
a plurality of display units, at least one display unit being arranged on each island;
a plurality of wiring units each coupled between the display units on the islands and arranged on the bridge; and
a thin film encapsulation layer comprising a first encapsulation portion covering a side of each display unit away from the base substrate and a second encapsulation portion at least covering a side of each display unit adjacent to the opening pattern, the second encapsulation portion being used to protect a side of the display unit adjacent to the opening pattern,
wherein each of at least a part of opening patterns has different opening sizes at a side of the base substrate adjacent to the display unit and a side of the base substrate away from the display unit, the opening pattern has at least one step-like structure at a side adjacent to the island, and the thin film encapsulation layer is interrupted at the step-like structure.

2. The stretchable display substrate according to claim 1, wherein the base substrate comprises a first substrate and a second substrate arranged at a side of the first substrate adjacent to the display unit, and the opening pattern has different opening sizes in the first substrate and the second substrate.

3. The stretchable display substrate according to claim 2, wherein the opening size of the opening pattern in the first substrate is smaller than the opening size of the opening pattern in the second substrate, at least a part of the first substrate adjacent to the second substrate is not covered by the second substrate and provided with a first step-like structure, and a region of the first substrate adjacent to the second substrate and not covered by the second substrate is a first step surface of the first step-like structure.

4. The stretchable display substrate according to claim 3, wherein a spacer is arranged on the first step surface, a third encapsulation portion is arranged at a side of the spacer away from the first substrate, and the third encapsulation portion is separated from the second encapsulation portion through the spacer.

5. The stretchable display substrate according to claim 4, wherein the spacer comprises a continuous spacer extending in a first direction, and the first direction is an extension direction of a boundary between the island and the opening pattern; or the spacer comprises discrete spacers arranged in at least one row in a direction away from the display unit, the discrete spacers in each row comprise a plurality of discrete spacers spaced apart from each other in the first direction.

6. The stretchable display substrate according to claim 4, wherein a sectional shape of the spacer is at least one of an inverted-trapezoidal shape or an inverted-triangular shape in a direction perpendicular to the base substrate.

7. The stretchable display substrate according to claim 4, wherein the first step surface is provided with a plurality of protrusions at a side of the spacer adjacent to the opening pattern and/or a side of the spacer away from the opening pattern, and a height of each protrusion in a direction perpendicular to the first substrate is smaller than a height of the spacer in the direction perpendicular to the first substrate, wherein each protrusion is provided with a snow-like, spherical or net-like pattern.

8. The stretchable display substrate according to claim 3, wherein the opening size of the opening pattern in the first substrate is greater than the opening size of the opening pattern in the second substrate, at least a part of the second substrate adjacent to the first substrate does not overlap the first substrate and is provided with a second step-like structure, a region of the second substrate adjacent to the first substrate and not overlapping the first substrate is a second step surface of the second step-like structure, and the second encapsulation portion is interrupted at the second step surface.

9. The stretchable display substrate according to claim 3, further comprising a first buffer layer, wherein the first buffer layer covers the first step surface and a side of the first substrate adjacent to the opening pattern in a shape-following manner, a part of the second encapsulation portion covers a side of the first buffer layer away from the first substrate in a shape-following manner, the other part of the second encapsulation portion covers a side of the display substrate adjacent to the opening pattern in a shape-following manner, and an adhesive force between a material of the first buffer layer and a base material of the first step surface is greater than an adhesive force between a material of the second encapsulation portion and the base material of the first step surface.

10. The stretchable display substrate according to claim 9, wherein the thin film encapsulation layer comprises a first inorganic encapsulation layer, a second inorganic encapsulation layer and a first organic encapsulation layer between the first inorganic encapsulation layer and the second inorganic encapsulation layer in a direction away from the base substrate, each of the first inorganic encapsulation layer and the second inorganic encapsulation layer at least covers a side of each of the display unit and the wiring unit away from the base substrate and a surface of the display unit adjacent to the opening pattern, and the first organic encapsulation layer at least covers a side of the display unit away from the base substrate,
wherein the stretchable display substrate further comprises a second buffer layer, and the second buffer layer covers the first step surface and a side of the first substrate adjacent to the opening pattern in a shape-following manner to increase an adhesive force between the first inorganic encapsulation layer and the second inorganic encapsulation layer.

11. The stretchable display substrate according to claim 10, wherein a base material of the first step surface comprises silicon dioxide, each of the first buffer layer and the second buffer layer is a metal thin film, and an oxide of a metal material of the metal thin film is bound to a silicon oxygen bond of the base material of the first step surface,
wherein the metal material comprises at least one of titanium, aluminium or manganese.

12. The stretchable display substrate according to claim 10, wherein the display unit comprises a first planarization layer covering a side of the second substrate away from the first substrate, a size of an opening in the first planarization layer at a side adjacent to the opening pattern is greater than the opening size of the opening pattern in the second substrate, at least a part of the second substrate away from the first substrate is not covered by the first planarization layer and is provided with a third step-like structure, a region of the second substrate away from the first substrate and not covered by the first planarization layer is a third step surface of the third step-like structure, the first buffer layer covers the third step surface in a shape-following manner, and
when a second buffer layer is arranged between the first inorganic encapsulation layer and the second inorganic encapsulation layer, the second buffer layer covers the third step surface in a shape-following manner.

13. A method for manufacturing the stretchable display substrate according to claim 1, the method comprising:
providing a rigid support plate;
forming a base substrate on the rigid support plate, a plurality of opening patterns being distributed on the base substrate, a plurality of bridges being formed between adjacent ones of at least a part of opening patterns in the plurality of opening patterns to define islands, each of at least a part of opening patterns having different opening sizes at a side of the base substrate adjacent to a display unit and a side of the base substrate away from the display unit so that the opening pattern at least forms at least one step-like structure at a side adjacent to the island;
forming a plurality of display units and a plurality of wiring units on the base substrate, at least one display unit being arranged on each island, each wiring unit being coupled between the display units on the islands and arranged on the bridge;
forming a thin film encapsulation structure, the thin film encapsulation structure covering a side of the display unit away from the base substrate, a side of the display unit adjacent to the opening pattern, a side of the wiring unit away from the base substrate, a side of the wiring unit adjacent to the opening pattern and a side of the base substrate in the opening pattern away from the rigid support plate in a shape-following manner; and
peeling the base substrate off from the rigid support plate, wherein a portion of the thin film encapsulation structure covering a side of the wiring unit away from the base substrate, a side of the wiring unit adjacent to the opening pattern and a side of the base substrate in the opening pattern away from the rigid support plate is peeled off to form a thin film encapsulation layer, the thin film encapsulation layer comprises a first encapsulation portion covering a side of the display unit away from the base substrate and a second encapsulation portion at least covering a side of the display unit adjacent to the opening pattern, and the second encapsulation portion is used to protect a side of the display unit adjacent to the opening pattern.

14. The method according to claim 13, wherein when the stretchable display substrate according to claim 4 is manufactured, prior to forming the thin film encapsulation structure, the method further comprises forming an optically clear adhesive layer on the first step surface, and patterning the optically clear adhesive layer to form a spacer,
wherein when forming the thin film encapsulation structure, the thin film encapsulation structure covers a side of the spacer away from a first substrate in a shape-following manner, a third encapsulation portion of the thin film encapsulation structure covering a side of the spacer away from the first substrate is separated from the second encapsulation portion of the thin film encapsulation structure covering a side of the display unit adjacent to the opening pattern through the spacer, and the second encapsulation portion is separated from the portion of the thin film encapsulation structure covering a side of the base substrate in the opening pattern away from the rigid support plate through the spacer.

15. The method according to claim 13, wherein when the stretchable display substrate according to claim 8 is manufactured, and the thin film encapsulation structure is interrupted through a segment difference formed by the second step surface during the formation of the thin film encapsulation structure.

16. The method according to claim 14, wherein the forming the optically clear adhesive layer on the first step surface and patterning the optically clear adhesive layer to form the spacer comprises applying a positive or negative photoresist to form the optically clear adhesive layer, and patterning the optically clear adhesive layer through exposing, developing and etching to form the spacer.

17. The method according to claim 16, wherein when the stretchable display substrate according to claim 7 is manufactured, the spacer and a plurality of protrusions are formed through one single patterning process.

18. The method according to claim 13, wherein when the stretchable display substrate according to claim 2 is manufactured, the forming the base substrate on the rigid support plate comprises forming the opening patterns on the first substrate and the second substrate through etching.

19. The method according to claim 13, wherein when the stretchable display substrate according to claim 12 is formed, prior to forming the thin film encapsulation structure and subsequent to forming the plurality of display units and the plurality of wiring units on the base substrate, the method further comprises:

forming a first evaporation film layer at a side of the second substrate in the opening pattern away from the first substrate, an adhesive force between the first evaporation film layer and a base material of the second substrate being smaller than an adhesive force between the thin film encapsulation layer and the base material of the second substrate;

forming a first buffer layer, the first buffer layer covering the first step-like structure and the third step-like structure in a shape-following manner;

forming a first inorganic encapsulation layer, the first inorganic encapsulation layer covering the first buffer layer, a side of the display unit not covered by the first buffer layer and adjacent to the opening pattern, a side of the wiring unit adjacent to the opening pattern, a side of the display unit away from the base substrate and a side of the wiring unit away from the base substrate in a shape-following manner;

forming a second buffer layer, the second buffer layer covering the first step-like structure and the third step-like structure in a shape-following manner;

forming a first organic encapsulation layer, the first organic encapsulation layer covering a side of the display unit away from the base substrate in a shape-following manner; and forming a second inorganic encapsulation layer, the second inorganic encapsulation layer covering the first buffer layer, a side of the display unit not covered by the first buffer layer and adjacent to the opening pattern, a side of the wiring unit adjacent to the opening pattern, a side of the display unit away from the base substrate and a side of the wiring unit away from the base substrate in a shape-following manner.

20. The method according to claim 19, wherein the first evaporation film layer is formed through vacuum evaporation and made of an organic material or a metal material;

each of the first buffer layer and the second buffer layer is deposited through magnetron-sputtering;

the first inorganic encapsulation layer is formed through chemical vapor deposition;

the second inorganic encapsulation layer is formed through chemical vapor deposition;

the first organic encapsulation layer is formed through ink-jet printing.

* * * * *